US012529133B1

(12) United States Patent
Nanjundappa et al.

(10) Patent No.: US 12,529,133 B1
(45) Date of Patent: Jan. 20, 2026

(54) SPUTTER SYSTEM WITH MAGNET MOTION SOURCE

(71) Applicant: Applied Materials, Inc., Santa Clara, CA (US)

(72) Inventors: Nagabhushana Nanjundappa, Bangalore (IN); Kirankumar Neelasandra Savandaiah, Bangalore (IN); Bhaskar Prasad, Jamshedpur (IN); Bryan Jeffrey Puch, Kalispell, MT (US); Martin Lee Riker, Milpitas, CA (US); Keith A. Miller, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/919,831

(22) Filed: Oct. 18, 2024

(51) Int. Cl.
*C23C 14/35* (2006.01)
*H01J 37/34* (2006.01)

(52) U.S. Cl.
CPC .......... *C23C 14/35* (2013.01); *H01J 37/3455* (2013.01)

(58) Field of Classification Search
CPC ............................ C23C 14/35; H01J 37/3455
USPC .......................................... 204/298.2, 298.21
See application file for complete search history.

(56) References Cited

U.S. PATENT DOCUMENTS

2008/0060938 A1* 3/2008 Miller ................. H01J 37/3408 204/298.03

FOREIGN PATENT DOCUMENTS

| | | | | |
|---|---|---|---|---|
| CN | 106854752 | * | 6/2017 | |
| JP | 2006084019 A | * | 3/2006 | |
| WO | WO-2006023257 A1 | * | 3/2006 | .......... H01J 37/3405 |
| WO | WO-2023186295 A1 | * | 10/2023 | ............ C23C 14/35 |

OTHER PUBLICATIONS

Machine Translation JP 2006084019 (Year: 2006).*
Machine Translation CN 106854752 (Year: 2017).*

* cited by examiner

*Primary Examiner* — Rodney G McDonald
(74) *Attorney, Agent, or Firm* — Patterson + Sheridan, LLP

(57) ABSTRACT

A sputter source assembly for a sputter system is disclosed. The sputter source assembly includes a magnetron movable within a reservoir. The sputter source assembly also includes a magnetron actuator having first and second shafts extending along an axis and passing from an interior of the reservoir to an exterior thereof. Further, the magnetron actuator includes first and second motors disposed external to the reservoir and each aligned coaxially with the axis, the first and second motors being arranged to rotatably drive the first and second shafts, respectively, so as to cause movement of the magnetron.

20 Claims, 7 Drawing Sheets

SPUTTER SYSTEM WITH MAGNET MOTION SOURCE

BACKGROUND

Field

Embodiments of the present disclosure generally relate to sputtering systems for depositing materials onto a wafer. In particular, the present disclosure relates to a sputter system having a sputter source assembly for moving a magnetron.

Description of the Related Art

Sputtering, alternatively called physical vapor deposition (PVD), has long been used in depositing metals and other materials in the fabrication of semiconductor integrated circuits. Sputter systems, or sputter chambers, typically include a magnetron positioned at the back of a sputtering target to project a magnetic field into a processing space to increase the density of plasma and enhance the sputtering rate. Typically, the magnetron is rotated about a center of the circular target to provide a more uniform erosion pattern of the target and deposition profile on the circular wafer. Some sputter systems utilize relatively complex hardware mechanisms involving belt and pulley drives for moving the magnetron. Belt and pulley drives may be susceptible to failures as well as fluid and process current leakage.

SUMMARY

The present disclosure generally relates to a sputter system having a sputter source assembly for moving a magnetron.

In one aspect, a sputter source assembly for a sputter system is provided. The sputter source assembly includes a magnetron movable within a reservoir. The sputter source assembly also includes first and second shafts extending along an axis and passing from an interior of the reservoir to an exterior thereof. Further, the sputter source assembly includes first and second motors disposed external to the reservoir and each aligned coaxially with the axis, the first and second motors being arranged to rotatably drive the first and second shafts, respectively, so as to cause movement of the magnetron.

In another aspect, a magnetron actuator for moving a magnetron of a sputter source assembly is provided. The magnetron actuator includes an outer rotary shaft extending along an axis. The magnetron actuator also includes an inner rotary shaft extending along the axis and passing through the outer rotary shaft. Further, the magnetron actuator includes a first motor coupled with the inner rotary shaft and being arranged coaxially with the axis. In addition, the magnetron actuator includes a second motor coupled with the outer rotary shaft and being arranged coaxially with the axis.

In yet another aspect, a sputter system is provided. The sputter system includes a main chamber arranged to receive a wafer. The sputter system also includes a sputter source assembly having a magnetron and a magnetron actuator arranged to move the magnetron to cause sputtering of material onto the wafer. The magnetron actuator includes an epicyclic gear system coupled with the magnetron; first and second shafts extending along an axis and each coupled with the epicyclic gear system; and first and second motors each aligned coaxially with the axis and arranged to rotatably drive the first and second shafts, respectively, so as to cause the epicyclic gear system to move the magnetron.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides a sputter system having a sputter source assembly for moving a magnetron. In one example aspect, the sputter source assembly can include a magnetron actuator that can be controlled to move the magnetron positioned at the back of a sputtering target. Movement of the magnetron can project a magnetic field into a processing chamber to increase the density of plasma and enhance the sputtering rate. The magnetron can be located within a reservoir containing a coolant (e.g., deionized water) and moved about to provide a uniform target erosion pattern and deposition profile on a wafer disposed in the processing chamber. The magnetron actuator can include first and second rotary shafts extending along an axis and passing from an interior of the reservoir to an exterior thereof. Further, the magnetron actuator can include first and second motors disposed external to the reservoir and each aligned coaxially with the axis. The first and second motors can be arranged to rotatably drive the first and second shafts, respectively, so as to cause movement of the magnetron within the reservoir.

By arranging the first and second motors coaxially with the axis, the first and second motors can be positively coupled with magnetron and planetary motion behind the target can be achieved with reduced or no motion loss. Further, compared to systems having hardware mechanisms involving belt and pulley drives for moving the magnetron, the coaxial arrangement of the motors with the axis can allow for fewer parts, better packaging of the system, reduced number of failure points, and less mechanical power transmission loss, among other benefits, advantages, and/or technical effects.

Further, embodiments of the sputter source assembly disclosed herein can include features for electrically grounding electric current that has "leaked" from the target during operation. Components of the sputter source assembly can be arranged to provide electrical grounding paths that prevent or reduce the leaked electric current from affecting the bearings and/or first and second motors of the magnetron actuator, which can ensure high efficiency of the bearings and motors. Moreover, certain components of the sputter source assembly that are exposed to the coolant within the reservoir, and thus the leaked electric current from the target, can include materials and/or coatings that prevent corrosion and act as insulators to reduce electric current leakage to the sputter source assembly.

Figure 1:
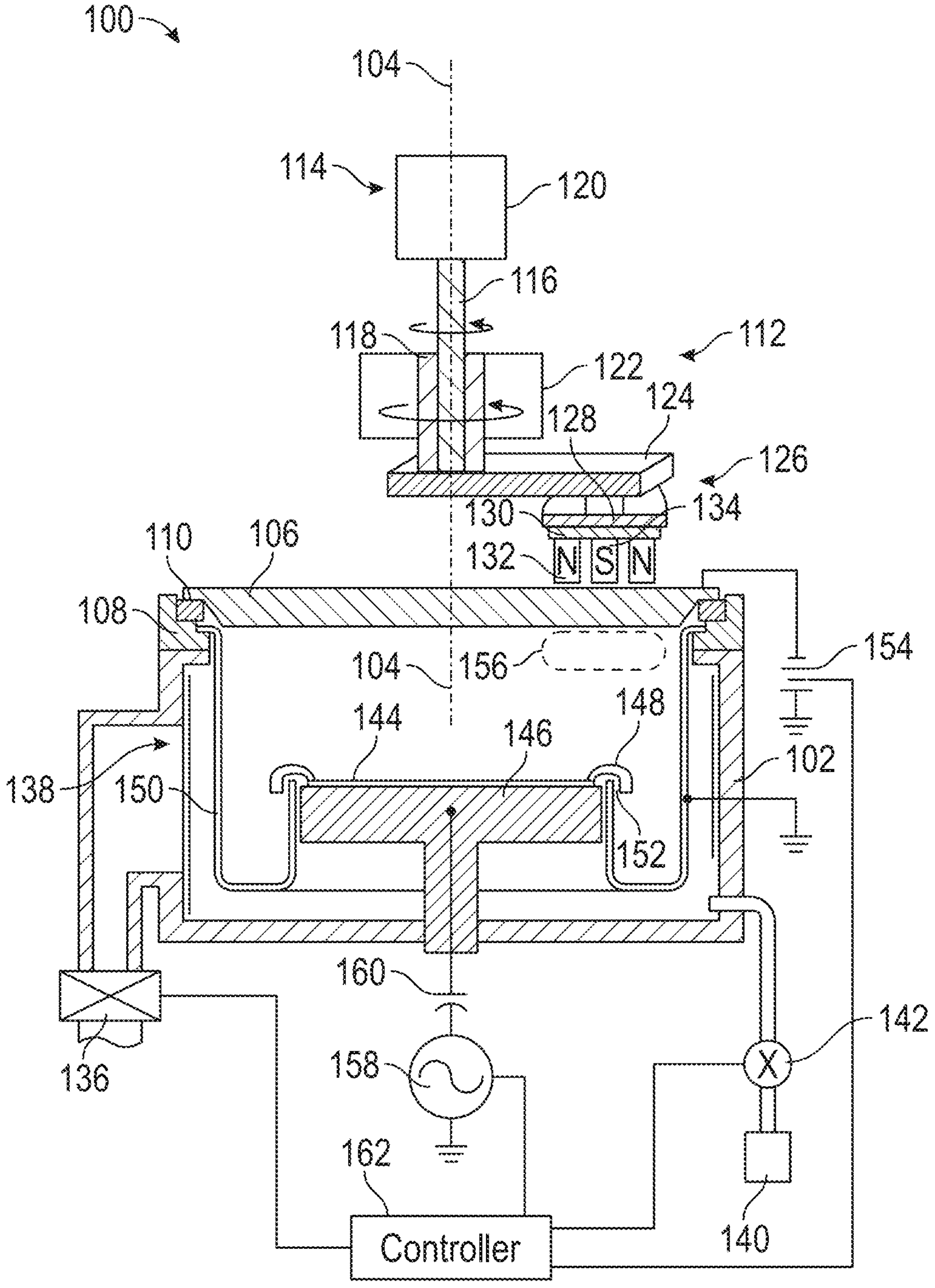
FIG. 1 is a schematic cross-sectional view of a sputter chamber, according to embodiments of the present disclosure.

FIG. 1 is a schematic cross-sectional view of a sputter system 100, according to embodiments of the present disclosure. The sputter system 100, or sputter chamber, includes a main chamber 102 arranged symmetrically around a central axis 104. The main chamber 102 supports a target 106 through an adapter 108 and an isolator 110. The target 106 may be formed from a material to be sputtered or may include a target tile facing the interior of the main chamber 102 and bonded to a backing plate extending laterally over the isolator 110.

The sputter system 100 also includes a sputter source assembly 112 having a magnetron actuator 114. The magnetron actuator 114 includes, among other things, an inner rotary shaft 116 and a tubular outer rotary shaft 118. The inner and outer rotary shafts 116, 118 are coaxial and are arranged about and extend along the central axis 104. In this regard, the inner and outer rotary shafts 116, 118 are coaxial with each other as well as the central axis 104. The inner rotary shaft 116 and the tubular outer rotary shaft 118 are rotatable about the central axis 104. The magnetron actuator 114 also includes first and second motors 120, 122 aligned coaxially with the central axis 104. That is, a motor axis of the first motor 120 and a motor axis of the second motor 122 can be arranged coaxially with one another and the central axis 104. The first and second motors 120, 122 are arranged to rotatably drive the inner and outer rotary shafts 116, 118. In some embodiments, the first and second motors 120, 122 can be controlled to drivingly rotate their respective inner and outer rotary shafts 116, 118 independently of one another. In other embodiments, the first and second motors 120, 122 can be controlled to drivingly rotate their respective inner and outer rotary shafts 116, 118 in unison with one another.

As further illustrated in FIG. 1, the inner and outer rotary shafts 116, 118 are coupled to an epicyclic mechanism, or epicyclic gear system 124, which supports a magnetron 126 through a mount 128 and is arranged to scan the magnetron 126 over the back of the target 106, e.g., in a nearly arbitrary pattern or a predefined pattern. The magnetron 126 typically includes a magnetic yoke 130 supporting and magnetically coupling at least an inner pole 132 of one magnetic polarity and at least an outer pole 134 of opposed magnetic polarity. The inner pole 132 is arranged radially inward of the outer pole 134 with respect to the central axis 104.

A vacuum pump 136 is arranged to pump fluid within the interior of the main chamber 102 through a pumping port 138. A gas source 140 supplies a sputter working gas, such as argon, into the main chamber 102 through a mass flow controller 142. If reactive sputtering is desired, for example, of a metal nitride, a reactive gas, such as nitrogen in one example, is also supplied.

A wafer 144 or other substrate is supported on a pedestal 146 configured as an electrode in opposition to the target 106. A clamp ring 148 may be used to hold the wafer 144 to the pedestal 146 or to protect the pedestal periphery. In other embodiments, an electrostatic chuck can be used to hold the wafer 144 against the pedestal 146. An electrically grounded shield 150 supported by the adapter 108 protects the chamber walls and sides of the pedestal 146 from sputter deposition and also acts as an anode in the plasma discharge. The working gas enters the main processing area through a gap 152 between the clamp ring 148 or pedestal 146 and the shield 150. Other shield configurations may include an electrically floating secondary shield inside the primary shield 150 and perforations through portions of the primary shield 150 protected by the secondary shield to promote gas flow into the processing area.

A DC power supply 154 negatively biases the target 106 with respect to the grounded shield 150 and causes the working gas (e.g., argon) to be excited and discharged into a plasma. The magnetron 126 concentrates the plasma and creates a high density plasma (HDP) region 156 underneath the magnetron 126 inside the main chamber 102. The positively charged argon ions are attracted to the target 106 with sufficient energy to sputter the metal from the target 106. The sputtered metal deposits on and coats the surface of the wafer 144. In some embodiments, such as for deep hole filling, an RF power supply 158 can be connected to the pedestal electrode 146 through a capacitive coupling circuit 160, which acts as a high-pass filter, to create a negative DC self-bias on the wafer 144. The negative DC self-bias is effective at accelerating positive metal ions or possibly argon ions toward the wafer 144 in perpendicular trajectories that more easily enter high-aspect holes. The negative DC self-bias also imparts high energy to the ions, which may be controlled to differentiate sputter deposition on the wafer 144 and sputter etching of the wafer 144.

A main controller 162 can be arranged to control the vacuum pump 136, the mass flow controller 142, the power supplies 154, 158, and the drive circuits for the first and second motors 120, 122 according to the desired sputtering conditions and scan patterns. The main controller 162 can include one or more processors and one or more memory devices, such as one or more non-transitory memory devices. The memory devices can store instructions that can be executed by the one or more processors, which causes the one or more processors to perform an operation, such as a sputtering operation.

Figure 2:
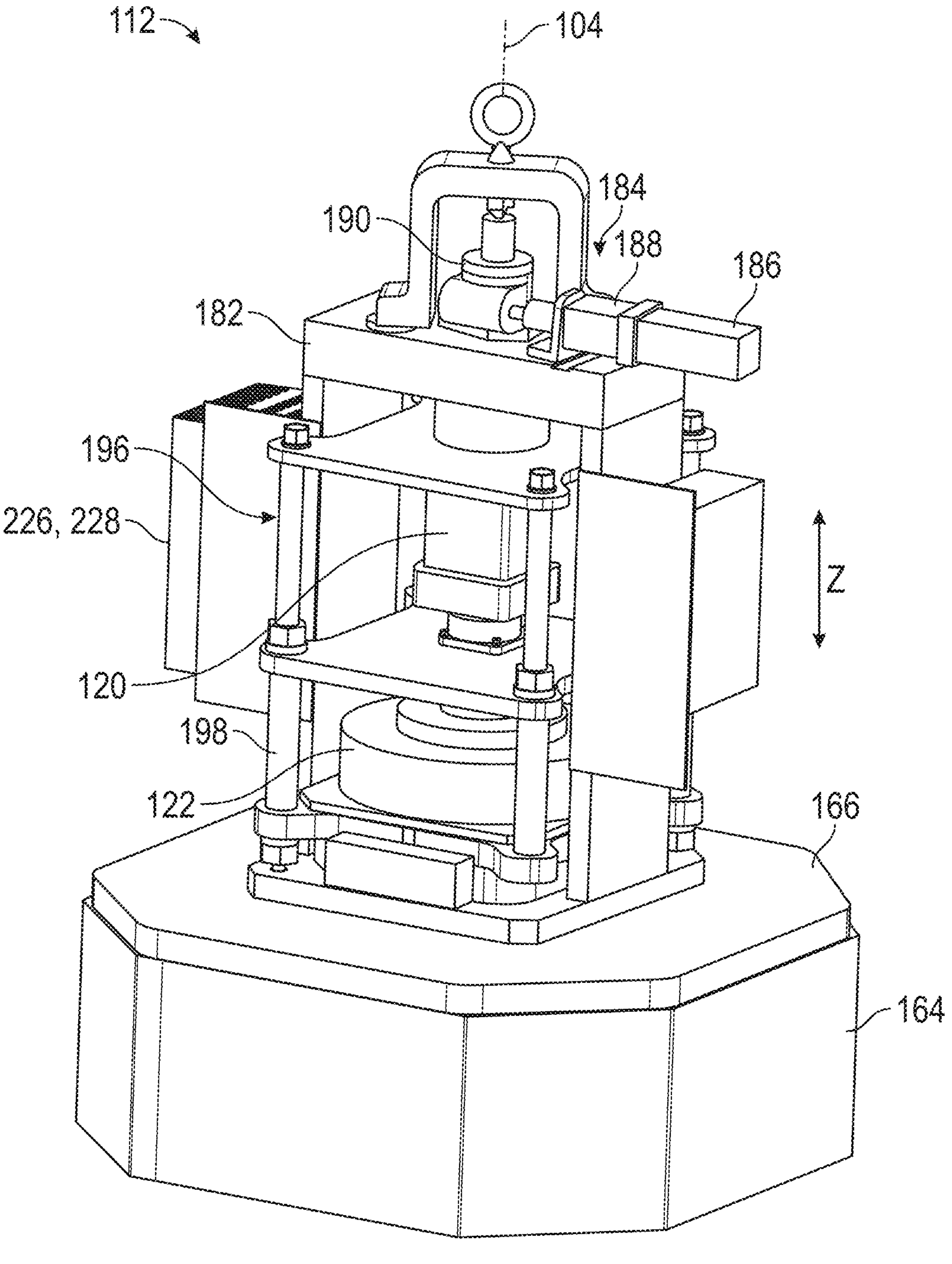
FIGS. 2 and 3 depict an orthographic view and a sectioned orthographic view of a sputter source assembly, according to embodiments of the present disclosure.
Figure 3:
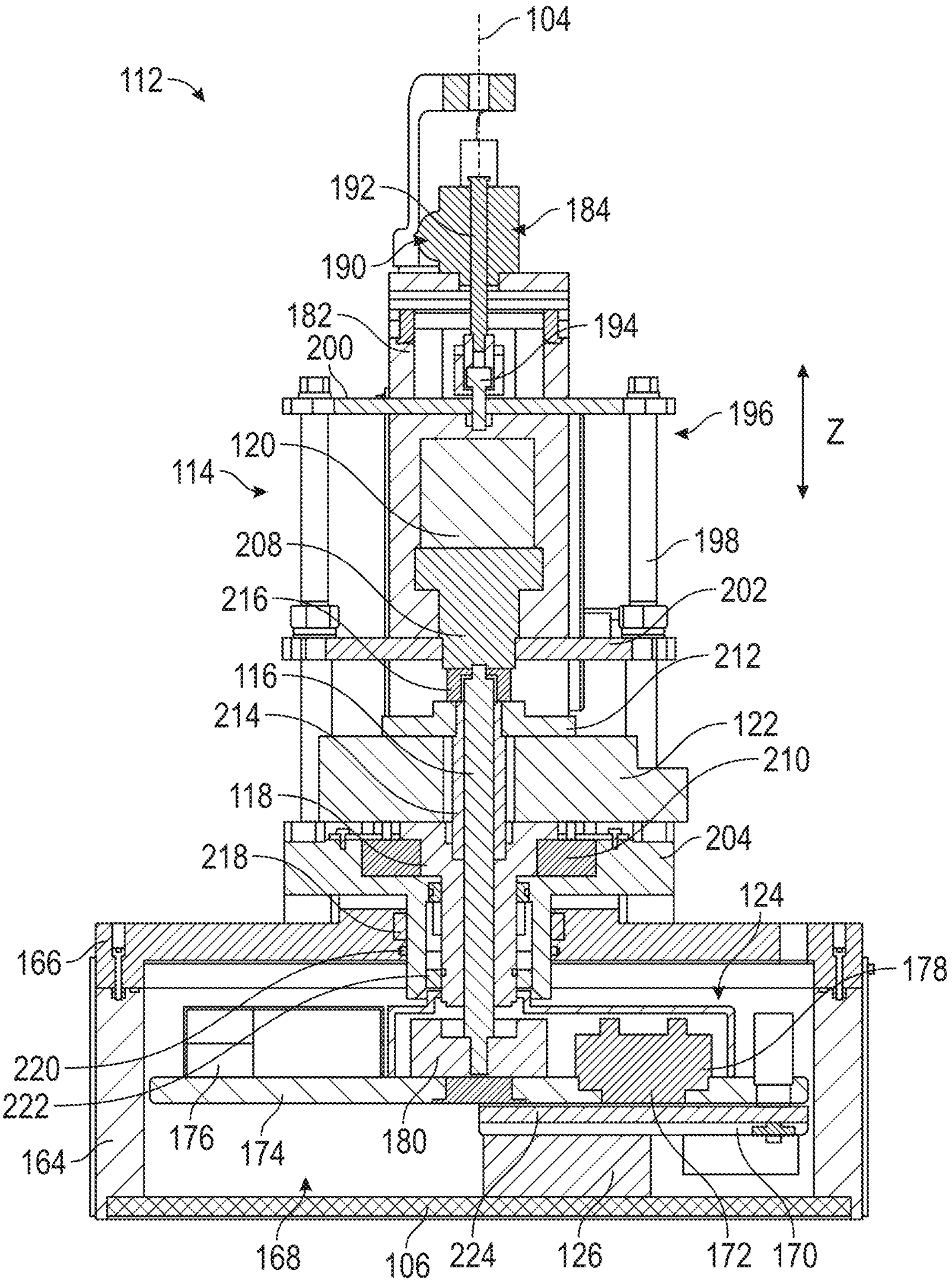

With reference now to FIGS. 1, 2, and 3, the sputter source assembly 112 will be further described. FIGS. 2 and 3 depict the sputter source assembly 112 in a full orthographic view and sectioned orthographic view, respectively.

The target 106 is supported on, and vacuum sealed to, the main chamber 102 of the sputter system 100 and is connected to the DC power supply 154 for exciting the sputter plasma. At least a bottom face of the target 106 within the main chamber 102 is composed of the material to be sputtered, typically a metal, such as copper for a metallization or a refractory metal such as tantalum for a barrier layer.

The target layer may be bonded to a backing plate resting on the isolator 110 and exposed to the interior of the cooling reservoir. Other target materials are possible, such as a contact metal (e.g., titanium or tungsten) or a magnetic material (e.g., germanium-antimony-tellurium (GeSbTe)). A sputter working gas such as argon is at least initially supplied into the vacuum chamber and, when excited into a plasma, its positively charged ions sputter the negatively biased target 106. The pedestal 146 within the vacuum chamber supports the wafer 144 to be sputter coated in opposition to the target 106. A reservoir frame 164 is sealed to the target 106 but is electrically isolated therefrom. A lid 166 is sealed to the reservoir frame 164 and they together with the target 106 define a reservoir 168 for a cooling liquid recirculated through the reservoir 168 from an external chiller to cool the target 106 during plasma sputtering.

The epicyclic gear system 124 driven by the rotation of the two rotary shafts 116, 118 of the magnetron actuator 114 scans the magnetron 126 located within the reservoir 168 about the back of the target 106. The magnetron 126 projects a magnetic field into the processing space within the main chamber 102 near the sputtering face of the target 106 to intensify the sputtering plasma and increase the sputter rate. If the magnetron 126 is small and magnetically strong, the magnetron 126 may produce a large fraction of ionized sputtered metal atoms useful for deep hole filling and resputtering of the wafer 144. In some cases, the ionization fraction and density of the sputtered metal ions are high enough that they form a plasma that may act as the sputtering plasma and the supply of the sputter working gas may be decreased or stopped in a process called self-sustained sputtering (SSS). The magnetron 126 may be round or another shape and can include the inner pole 132 (e.g., of one vertical magnetic polarity) surrounded by the outer pole 134 (e.g., of the other polarity), as previously described. The inner pole 132 and the outer pole 134 can be separated from one another by an annular gap defining a plasma track adjacent the sputter face of the target 106. Typically, the outer pole 134 and possibly the inner pole 132 are composed of multiple cylindrical magnets. In some embodiments, the outer pole 134 has a larger total magnetic intensity than the opposed inner pole 132.

In some embodiments, the magnetron 126 may be arranged to concentrate target power near a small area adjacent to the magnetron 126, which may further increase the density of the plasma and hence increase the ionization fraction of atoms sputtered from the target 106. The epicyclic gear system 124 allows the rotary shafts 116, 118 to independently scan the magnetron 126 both azimuthally (circumferentially) and radially with respect to the central axis 104. Rectangular and star-shape scan patterns are also possible. Additionally, other mechanisms allow vertical movement of the magnetron 126 to optimize the distance between the magnetron 126 and the back of the target 106, for example to compensate for erosion of the front sputtering face of the target 106. The combination of separable control of rotation, radial positioning, and vertical position allows for universal magnet motion (UMM).

As shown in FIG. 3, in this example, the epicyclic gear system 124 is arranged as a planetary gear system. The magnetron 126 is fixed to an outer arm 170, which is coupled with a follower gear 172. The follower gear 172 is supported by a carrier 174, which also supports a counterweight 176 opposite the follower gear 172. The follower gear 172 is rotatably supported on an inner arm 178 formed as a casing to rotatably mount and seal the gears within. The follower gear 172 can be coupled with a sun gear 180 arranged concentrically about the central axis 104, e.g., through an idler gear (not pictured). The idler gear can also be rotatably supported on the inner arm 178. The shafts of the follower gear 172, the idler gear, and the sun gear 180 can be arranged in a triangular configuration to save space, for example. If at least the follower and sun gears 172, 180 have the same number of teeth, a unity gear ratio causes the rotation rates of the sun gear 180 and the follower gear 172 to be equal. In some embodiments, all three gears (i.e., the follower gear 172, the sun gear 180, and the idler gear) have the same number of teeth. In some other embodiments, the idler gear can be eliminated and the follower gear 172 may mesh directly with the sun gear 180. In yet other embodiments, there may be more than one intermediate idler gear. Further, in yet further embodiments, other epicyclic mechanisms having other configurations are possible.

In some embodiments, the inner arm 178 is fixed to the tubular outer rotary shaft 118 and the sun gear 180 is fixed to the inner rotary shaft 116 disposed inside the outer rotary shaft 118. The inner and outer rotary shafts 116, 118 are concentric with the central axis 104 and can be separately rotatable. The epicyclic gear system 124 can cause the magnetron 126 to move in epicyclic patterns or epicyclic motion. In epicyclic motion, the magnetron 126 rotates in circular motion about an offset rotation axis itself rotating in circular motion about the central axis 104 and fixed rotation rates or synchronism between the two rotary movements is not assumed.

As further illustrated in FIGS. 1, 2, and 3, the magnetron actuator 114 is supported on a derrick 182, which is supported on and extends above the reservoir lid 166. A vertical actuator 184 mounted on top of the derrick 182 includes a motor 186, a gearbox 188, and a worm drive 190. The motor 186 is oriented so that a motor axis of the motor 186 is arranged perpendicular to the central axis 104. The worm drive 190 has an output shaft 192 connected to a floating coupler 194. The floating coupler 194 couples the worm drive 190 with a movable frame 196. The vertical actuator 184 operates to vertically move the movable frame 196 so that the inner and outer rotary shafts 116, 118, which are rotatably supported in the vertically movable frame 196, move in tandem along the central axis 104 to compensate for target erosion and/or other effects. The vertical movement for compensating target erosion may be relatively small, such as no more than the thickness of a target tile bonded to a backing plate, for example, about 2 cm or less. In some modes of operation, no compensation is made for erosion of less than 6 mm, but erosion of more than 6 mm benefits from compensation. A typical erosion limit in commercial operation is about 17 mm.

The movable frame 196 includes, among other things, a plurality of posts 198 (four (4) in this example), a top support plate 200, a motor support plate 202, and a housing 204. The top support plate 200, the motor support plate 202 and the housing 204 are each received by the posts 198. The floating coupler 194 is coupled with the top support plate 200. In this regard, when the worm drive 190 is driven by the motor 186 by way of the gearbox 188, the movable frame 196 can be moved vertically or along a Z-direction. The motor support plate 202 is disposed vertically below the top support plate 200 and supports a motor gearbox 208 coupled with the first motor 120.

The housing 204 encloses at least a portion of the outer rotary shaft 118, a bearing 210 supporting a stepped flange of the outer rotary shaft 118, and at least a portion of the inner rotary shaft 116 (which passes through the outer rotary shaft 118). The second motor 122 is arranged on, and is supported by, the housing 204. A motor clamp 212 arranged on, and coupled with, the second motor 122 supports a top end of a coupler shaft 214. A recess, or oblong stepped counter bore, formed in the outer rotary shaft 118 receives a bottom end of the coupler shaft 214. The inner rotary shaft 116 extends or passes through the coupler shaft 214 as the inner rotary shaft 116 extends or passes through the second motor 122. In this regard, the coupler shaft 214 supports the inner rotary shaft 116 within the second motor 122. A spindle 216 or coupler shaft supports the inner rotary shaft 116 at the mechanical interface between the inner rotary shaft 116 and the motor gearbox 208.

In some embodiments, the inner and outer rotary shafts 116, 118 are rotatably supported within the movable frame 196. The housing 204 of the movable frame 196 is sealed to the reservoir lid 166 through a sliding seal 218, which prevents cooling liquid within the reservoir 168 from leaking out but allows the movable frame 196 to move vertically. An O-ring seal 220 is also arranged to prevent the cooling liquid from leaking from the reservoir 168. The lower end of the outer rotary shaft 118 is sealed to the housing 204 through a rotary seal 222 to prevent leakage of the cooling liquid (e.g., deionized water) while allowing the outer rotary shaft 118 to rotate. The inner rotary shaft 116 rotates within a sealed liquid-free region. A primary seal 224 is a dynamic seal between the casing of the inner arm 178 and the output shaft of the follower gear 172 supporting and rotating the outer arm 170. A backup seal can be located at the top end of the inner rotary shaft 118.

The first and second motors 120, 122 can be servo motors driven by first and second motor drives 226, 228, respectively. The first and second motor drives 226, 228 can be co-located and mounted to the derrick 182, e.g., as shown in FIG. 2. Configuring the first and second motors 120, 122 as servo motors can enable synchronized movement of the inner and outer rotary shafts 116, 118. In other aspects, however, the first and second motors 120, 122 may be driven by separate, nearly arbitrary drive signals so that they can be moved independently if desired. The first and second motors 120, 122 can be powered by flexible electrical cables.

In some embodiments, the two coaxial rotary drive shafts 116, 118 allow nearly arbitrary motion of the magnetron 126 about the back of the target 106. If the inner rotary shaft 116 is held stationary, a nearly parabolic repetitive scan path with a single lobe can be produced (e.g., with a 1:1 gear ratio). If the inner and outer rotary shafts 116, 118 rotate together in synchronism, the magnetron 126 can trace a circular path. The radius of rotation depends upon the phase difference between the rotations of the two rotary shafts 116, 118. This operation may be useful for some types of highly ionized sputtering from refractory targets, such as tantalum, in which the outer periphery is the primary sputtering area but the inner portion needs to be cleaned of redeposited material. During sputter deposition, the phase is selected to position the magnetron 126 near the periphery. During the center cleaning, the phase is adjusted to position the magnetron 126 near the center. If the two rotary shafts 116, 118 rotate at different rates, a more complicated scan pattern results, similar to a planetary pattern but more generally defined as an epicyclic pattern. Variations in the difference of rotation rates can change the number of lobes. The rotation rates need not be constant over a scan period.

By arranging the first and second motors 120, 122 coaxially with the central axis 104, the first and second motors 120, 122 can be positively coupled with magnetron 126 and planetary motion behind the target 106 can be achieved with reduced or no motion loss. Further, the coaxial arrangement of the first and second motors 120, 122 with the central axis 104 can allow for fewer parts, better packaging, reduced number of failure points, and less mechanical power transmission loss, compared to conventional systems.

In some embodiments, with reference to FIG. 3, one or more components of the sputter source assembly 112 exposed to the deionized water within the reservoir 168 can be formed of materials that enable improved shielding properties against electric current leakage from the target 106 but yet can also provide a barrier against corrosion from the deionized water within the reservoir 168.

For instance, in at least some example embodiments, the reservoir lid 166 arranged on the reservoir frame 164 and enclosing the reservoir 168 is formed of aluminum and includes a corrosive barrier. The reservoir frame 164 upon which the aluminum reservoir lid 166 is disposed can be formed of a fiber-reinforced plastic. In some embodiments, the corrosive barrier can be formed by hard anodizing a coating onto interior surfaces of the reservoir lid 166 exposed to the deionized water within the reservoir 168. The coating can be polytetrafluoroethylene (PTFE), for example. The coating can be sealed with a sealant. In other embodiments, the corrosive barrier can be formed at least in part by a liner seated on one or more of the interior surfaces. The liner can be formed of an electrically-insulating material, such as PTFE, for example. Examples are provided below.

Figure 4:
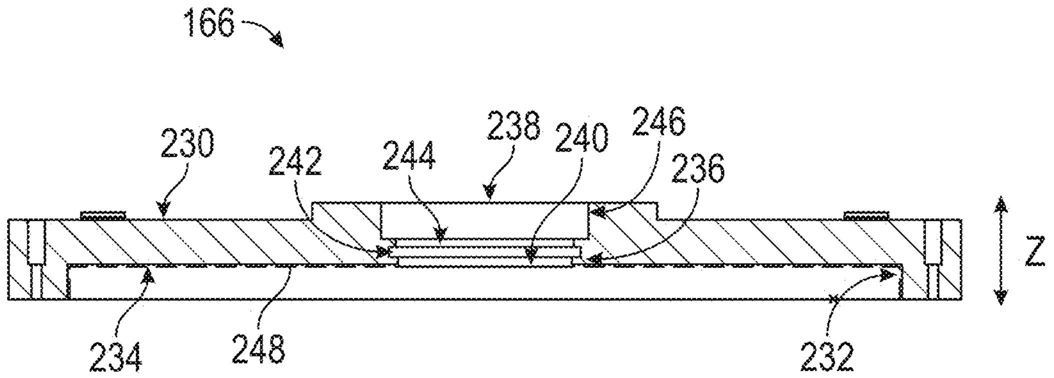
FIG. 4 depicts a cross-sectional view of a reservoir lid that can be implemented in the sputter source assembly of FIGS. 2 and 3, according to embodiments of the present disclosure.

FIG. 4 depicts a cross-sectional view of the reservoir lid 166 according to various embodiments of the present disclosure. As shown, the reservoir lid 166 is formed of aluminum and includes exterior surfaces 230 and interior surfaces. The interior surfaces face toward the reservoir 168 (FIG. 3), and consequently, are exposed to deionized water within the reservoir 168. The interior surfaces include at least an interior sidewall 232, an interior base wall 234, and an opening sidewall 236. The reservoir lid 166 defines or forms a pass through opening 238 that allows the inner and outer rotary shafts 116, 118 to pass through the reservoir lid 166 into the interior of the reservoir 168, e.g., as shown in FIG. 3. The pass through opening 238 has a varying diameter along the vertical or Z-direction. Vertically above and adjacent to a first step 240 formed by the opening sidewall 236 is an O-ring recess 242 arranged to receive the O-ring 220 (FIG. 3). A second step 244 is arranged vertically above and adjacent to the O-ring recess 242. A sliding seal recess 246 is arranged vertically above and adjacent to the second step 244. The sliding seal recess 246 is arranged to receive the sliding seal 218 (FIG. 3). As shown in the illustrated embodiment of FIG. 4, the corrosive barrier is formed at least by the interior sidewall 232, the interior base wall 234, and the opening sidewall 236 being coated with a coating 248, such as PTFE. The coating 248, or electrically-insulating coating, can be hard anodized onto the interior surfaces of the reservoir lid 166 and sealed with a sealant, for example. The coating 248 can protect the reservoir lid 166 from corrosion caused by exposure to deionized water within the reservoir 168 and also acts as insulator between the target 106 (FIG. 3) and the aluminum body of the reservoir lid 166. The aluminum reservoir lid 166 can provide desirable shielding properties against electric current leakage from the target 106 (FIG. 3).

In some further embodiments, the reservoir lid 166 includes a main body formed of aluminum. A liner formed of PTFE or another fluoropolymer can be seated on the interior base wall 234 and secured thereto, e.g., by one or more fasteners. The liner can define or form a liner opening arranged to align with the pass through opening 238. The interior sidewall 232, the interior base wall 234, and/or the opening sidewall 236 can be hard anodized with a PTFE coating, for example. The liner can protect the main body from corrosion caused by exposure to deionized water within the reservoir 168 (FIG. 3) and also acts as insulator between the target 106 (FIG. 3) and the reservoir lid 166. The aluminum main body of the reservoir lid 166 can provide desirable shielding properties against electric current leakage from the target 106 (FIG. 3).

In yet further embodiments, other components of the sputter source assembly 112 of FIGS. 2 and 3 exposed to the deionized water within the reservoir 168 can be formed of materials that enable improved shielding properties against electric current leakage from the target 106 but yet can provide a barrier against corrosion from the deionized water within the reservoir 168. For instance, the inner arm 178 depicted in FIG. 3 formed as a casing to rotatably mount and seal the gears therein can be formed of aluminum and coated with an electrically-insulating coating, such as fluoropolymer (e.g., PTFE). Particularly, the exterior surfaces of the inner arm 178 can be coated with a fluoropolymer (e.g., PFTE), which can provide corrosion resistance to the inner arm 178 and can insulate the inner arm 178, the gears disposed therein, the inner rotary shaft 116 coupled with the sun gear 180, etc. from leakage current from the target 106.

In some further aspects, the sputter source assembly 112 of FIGS. 2 and 3 can include an electrical grounding scheme that can ensure high efficiency of the bearings and motors thereof. As noted previously, during operation when a voltage is applied to the target 106, electric current can "leak" from the target 106 and travel through the reservoir 168 by way of the cooling liquid therein (e.g., deionized water). This "leakage current" can travel through the cooling liquid to electrically conductive components exposed to the cooling liquid. The sputter source assembly 112 is arranged to electrically ground such leakage current, e.g., to ensure high efficiency of the bearings and motors thereof.

Figure 5:
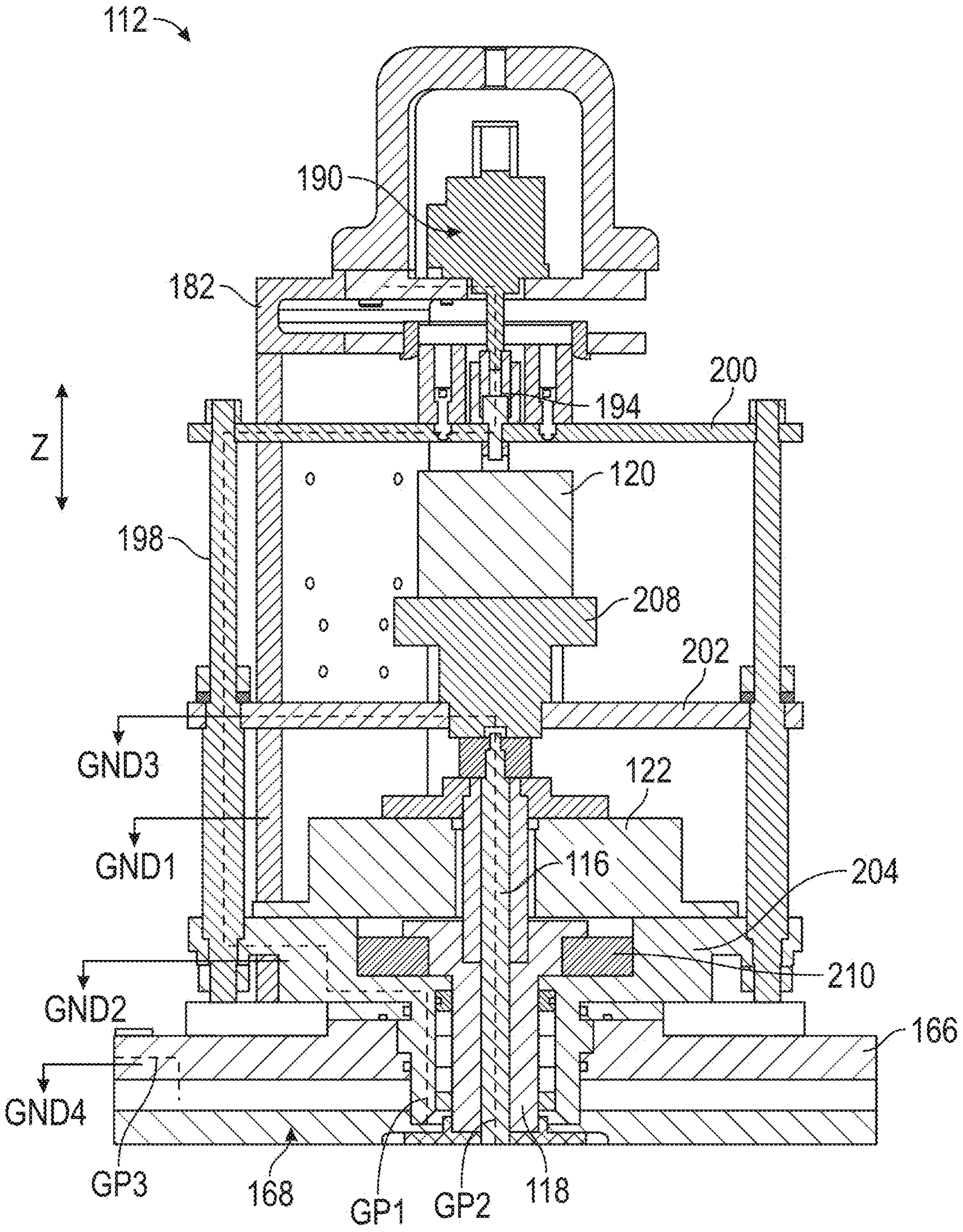
FIG. 5 depicts a cross-sectional view of the sputter source assembly of FIGS. 2 and 3 and illustrates electrical paths for grounding electrical current that has leaked from a target, according to embodiments of the present disclosure.

FIG. 5 depicts a cross-sectional view of the sputter source assembly 112 and illustrates electrical paths for grounding electrical current that has leaked from the target 106 (not pictured in FIG. 5; see FIG. 3). The architecture and/or packaging of the components of the sputter source assembly 112 can provide such electrical grounding paths.

A first electrical grounding path GP1 is defined so that electric current traveling through the cooling liquid in the reservoir 168 travels serially through the housing 204, through the posts 198 in an upward vertical direction, through the top support plate 200, through the floating coupler 194, through the worm drive 190, and then to the derrick 182. The electric current can return to a power source or dissipate via a derrick ground GND1. In some embodiments, electric current traveling along the first electrical grounding path GP1 can return to a power source or dissipate by way of a housing ground GND2.

A second electrical grounding path GP2 is defined so that electric current traveling through the cooling liquid in the reservoir 168 travels serially through the inner rotary shaft 118, through the motor gearbox 208 of the first motor 120, and through the intermediate plate 202. The electric current can return to a power source or dissipate via a motor mount ground, or GND3.

A third electrical grounding path GP3 is defined so that electric current traveling through the cooling liquid in the reservoir 168 travels through the reservoir lid 166. The electric current can return to a power source or dissipate via a lid ground GND4.

Accordingly, the sputter source assembly 112 is arranged to electrically ground electric current that has leaked from the target in such a way that the leakage current is directed away from, or not through, the bearing 210 and the first and second motors 120, 122, which facilitates high efficiency of the bearing 210 and the first and second motors 120, 122.

Figure 6:
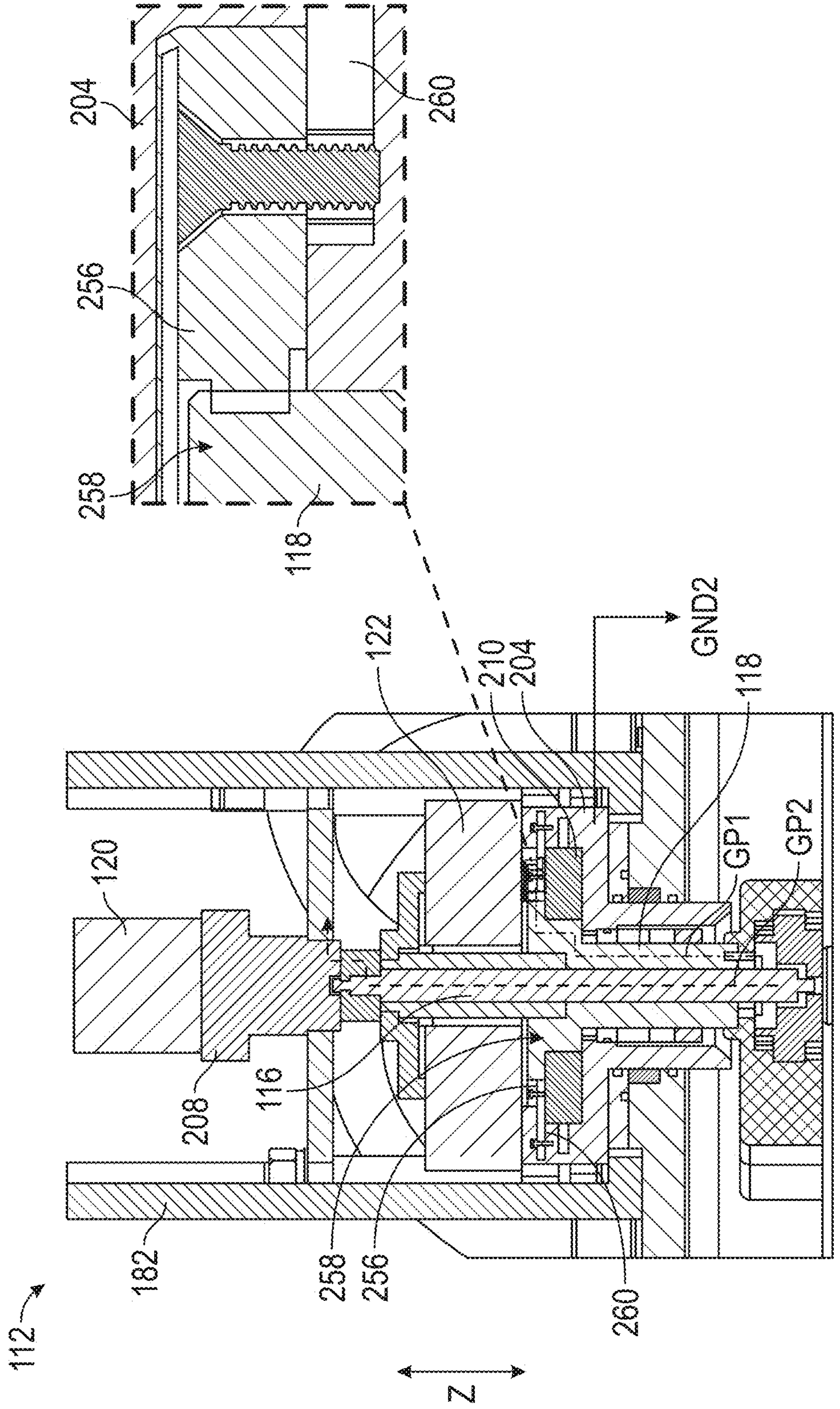
FIG. 6 depicts a cross-sectional view of a portion of the sputter source assembly of FIGS. 2 and 3 and illustrates an electrical path for grounding electrical current that has leaked from a target, according to embodiments of the present disclosure.

FIG. 6 depicts a cross-sectional view of a portion of the sputter source assembly 112 and illustrates an electrical path for grounding electrical current that has leaked from the target 106 (not pictured in FIG. 6; see FIG. 3). The architecture and/or packaging of the components of the sputter source assembly 112 can provide such an electrical grounding path.

As shown in FIG. 6, in some embodiments, electric current traveling along the first electrical grounding path GP1 can travel upward through the outer rotary shaft 118. To avoid or minimize the electric current flowing into the bearing 210, the sputter source assembly 112 can include a grounding brush 256 arranged to contact or rub onto the outer rotary shaft 118. Specifically, the grounding brush 256 can be arranged to contact an upper flange 258 of the outer rotary shaft 118. The grounding brush 256 can be annular or can be arranged in circumferentially-spaced segments along the outer periphery of the upper flange 258.

The grounding brush 256 can be mounted-to a grounding plate 260, e.g., by one or more fasteners. The grounding plate 260 can be annular or can be formed by a plurality of circumferentially-spaced segments, e.g., aligned with respective segments of the grounding brush 256. The grounding plate 260 can be mounted to the housing 204, e.g., by one or more fasteners. In this way, the grounding brush 256 can serve as a flexible conduit to the housing ground GND2. Specifically, leaked electric current can travel from the outer rotary shaft 118 to the grounding brush 256, through the grounding plate 260 and to the housing 204, and ultimately to the housing ground GND2. The grounding brush 256 can thus provide a path for electric current to travel that avoids the bearing 210 and the second motor 122, which can improve the service lives of these components.

Figure 7:
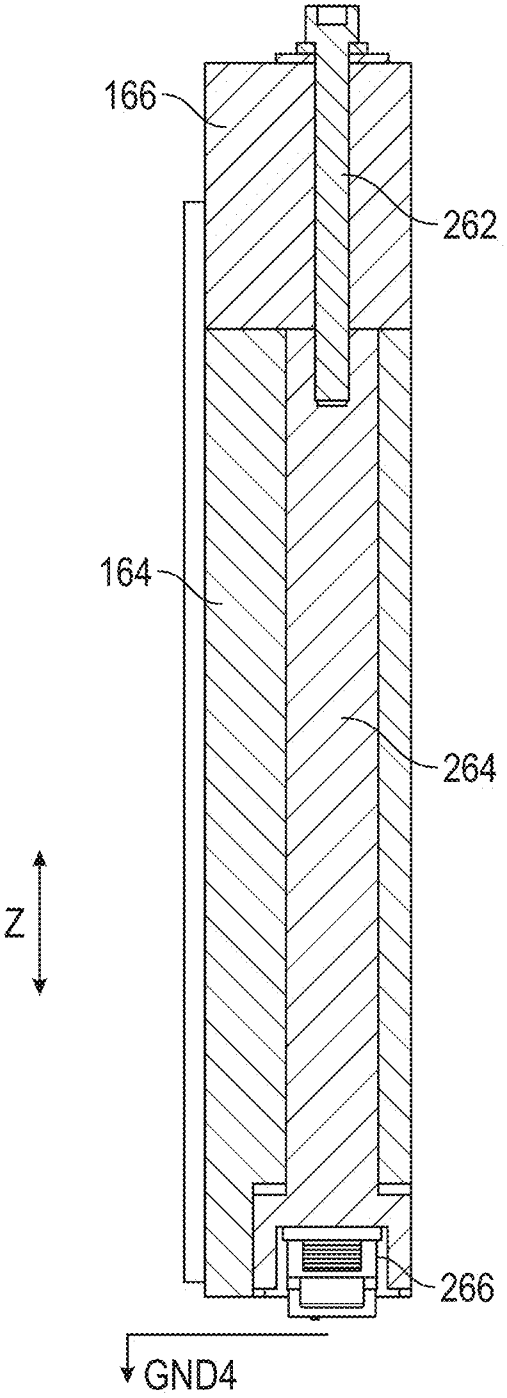
FIG. 7 depicts a close-up, cross-sectional view of a portion of the sputter source assembly of FIGS. 2 and 3 and illustrates an electrical path for grounding electrical current that has leaked from a target, according to embodiments of the present disclosure.

FIG. 7 depicts a close-up, cross-sectional view of a portion of the sputter source assembly 112 and illustrates an electrical path for grounding electrical current that has leaked from the target 106 (not pictured in FIG. 7; see FIG. 3). The architecture and/or packaging of the components of the sputter source assembly 112 can provide such an electrical grounding path.

As shown in FIG. 7, in some embodiments, electric current traveling along the third electrical grounding path GP3 can travel through the lid 166 and to a grounding fastener 262, which extends through the thickness of the lid 166 and at least partially into the frame 164 as depicted in FIG. 7. In such embodiments, the lid 166 can be formed of an electrically-conductive material, such as aluminum. The grounding fastener 262 contacts, and is received by, a grounding holder 264 arranged within a wall of the reservoir frame 164, which can be formed of a fiber-reinforced plastic. The grounding holder 264 is supported and in contact with a spring-loaded bias 266. The grounding holder 264 and the spring-loaded bias 266 can each be formed of aluminum and can be tin plated. The spring-loaded bias 266 can urge the grounding holder 264 in contact with the grounding fastener 262, and as a result, metal-to-metal contact can be maintained, e.g., even when subject to vibrations. The spring-loaded bias 266 can be electrically coupled with the lid ground GND4.

While the foregoing is directed to embodiments of the present disclosure, other and further embodiments of the disclosure may be devised without departing from the basic scope thereof, and the scope thereof is determined by the claims that follow.

What is claimed is:

1. A sputter source assembly for a sputter system, comprising:
   a magnetron movable within a reservoir;
   first and second shafts extending along an axis and passing from an interior of the reservoir to an exterior thereof; and
   first and second motors disposed external to the reservoir and each aligned coaxially with the axis, the first and second motors being arranged to rotatably drive the first and second shafts, respectively, so as to cause movement of the magnetron.

2. The sputter source assembly of claim 1, wherein the first and second shafts are separately rotatable about the axis.

3. The sputter source assembly of claim 1, wherein the second shaft is coupled with a sun gear of an epicyclic gear system arranged within the reservoir.

4. The sputter source assembly of claim 1, wherein the first shaft is coupled with an arm of an epicyclic gear system arranged within the reservoir.

5. The sputter source assembly of claim 1, further comprising:
   a vertical actuator having a worm drive and a motor coupled with the worm drive, the motor being oriented so that a motor axis of the motor is arranged perpendicular to the axis;
   a derrick; and
   a movable frame coupled with the worm drive and arranged to move relative to the derrick when the worm drive is driven by the motor, the first and second motors and the first and second shafts being mounted to the movable frame.

6. The sputter source assembly of claim 1, wherein the second motor is arranged vertically above the first motor and the second shaft passes through the first motor.

7. The sputter source assembly of claim 6, further comprising:
   a coupler shaft received within a recess of the first shaft and extending through the second motor, the first shaft extends through the coupler shaft as the first shaft extends through the second motor.

8. The sputter source assembly of claim 1, further comprising:
   a lid enclosing the reservoir, wherein the lid is formed of aluminum and coated with an electrically-insulating coating.

9. The sputter source assembly of claim 8, further comprising:
   a lid enclosing the reservoir, wherein the lid is formed of aluminum and has a liner formed of an electrically-insulating material.

10. The sputter source assembly of claim 1, further comprising:
   a epicyclic gear system having a casing enclosing at least a sun gear and a follower gear, wherein the casing is formed of aluminum and coated with an electrically-insulating coating.

11. The sputter source assembly of claim 1, further comprising:
   a bearing supporting a flange of the second shaft; and
   a grounding brush in contact with the flange and electrically coupled with a ground.

12. The sputter source assembly of claim 1, further comprising:
   a derrick;
   a movable frame having posts, a housing coupled with the posts and extending into the reservoir, and a support plate coupled with the posts; and
   a floating coupler coupled with the support plate, and
   wherein an electrical grounding path is defined so that electric current is arranged to travel serially through the housing, the posts, the support plate, the floating coupler, and to the derrick.

13. The sputter source assembly of claim 1, further comprising:
   a motor gearbox coupled with the first motor; and
   a movable frame having a support plate to which the first motor is coupled by way of the motor gearbox,
   wherein an electrical grounding path is defined so that electric current is arranged to travel serially through the second shaft, the motor gearbox, and the support plate, with the support plate being electrically coupled with a ground.

14. The sputter source assembly of claim 1, further comprising:
   a reservoir frame formed of an electrically-insulating material; and
   a lid enclosing the reservoir and mounted to the reservoir frame, wherein the lid is formed of aluminum and coated with an electrically-insulating coating, and
   wherein a grounding fastener extends through a thickness of the lid and at least partially into the reservoir frame so that the grounding fastener is received by a grounding holder within the reservoir frame, the grounding holder being electrically coupled with a ground.

15. A magnetron actuator for moving a magnetron of a sputter source assembly, the magnetron actuator comprising:
   an outer rotary shaft extending along an axis;
   an inner rotary shaft extending along the axis and passing through the outer rotary shaft;
   a first motor coupled with the inner rotary shaft and being arranged coaxially with the axis; and
   a second motor coupled with the outer rotary shaft and being arranged coaxially with the axis.

16. The magnetron actuator of claim 15, wherein the inner rotary shaft passes through the second motor.

17. The magnetron actuator of claim 16, further comprising:
   a coupler shaft received within a recess of the outer rotary shaft and extending through the second motor, the inner rotary shaft extends through the coupler shaft as the inner rotary shaft extends through the second motor.

18. The magnetron actuator of claim 15, further comprising:
   a bearing supporting a flange of the outer rotary shaft; and
   a grounding brush in contact with the flange and electrically coupled with a ground.

19. The magnetron actuator of claim 15, further comprising:
   an epicyclic gear system having a casing a sun gear enclosed within the casing, wherein the outer rotary shaft is coupled with the casing and the inner rotary shaft is coupled with the sun gear.

20. A sputter system, comprising:
   a main chamber arranged to receive a wafer;
   a sputter source assembly having a magnetron and a magnetron actuator arranged to move the magnetron to cause sputtering of material onto the wafer, wherein the magnetron actuator comprises:
      an epicyclic gear system coupled with the magnetron;

first and second shafts extending along an axis and each coupled with the epicyclic gear system; and first and second motors each aligned coaxially with the axis and arranged to rotatably drive the first and second shafts, respectively, so as to cause the epicyclic gear system to move the magnetron.

* * * * *